United States Patent
Kawabata

(10) Patent No.: US 6,862,217 B2
(45) Date of Patent: Mar. 1, 2005

(54) CONTROL METHOD OF NON-VOLATILE SEMICONDUCTOR MEMORY CELL AND NON-VOLATILE SEMICONDUCTOR MEMORY DEVICE

(75) Inventor: Shozo Kawabata, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/665,205

(22) Filed: Sep. 22, 2003

(65) Prior Publication Data

US 2004/0057288 A1 Mar. 25, 2004

(30) Foreign Application Priority Data

Sep. 20, 2002 (JP) ........................................ 2002-274753

(51) Int. Cl.[7] .............................................. G11C 16/04
(52) U.S. Cl. ............................ 365/185.18; 365/185.19; 365/185.22; 365/185.29
(58) Field of Search ....................... 365/185.18, 185.22, 365/185.19, 185.29

(56) References Cited

U.S. PATENT DOCUMENTS

| | | | | |
|---|---|---|---|---|
| 6,181,599 | B1 | * | 1/2001 | Gongwer ................ 365/185.18 |
| 6,285,593 | B1 | * | 9/2001 | Wong ..................... 365/185.23 |
| 6,735,122 | B2 | * | 5/2004 | Roohparvar ........... 365/185.22 |

FOREIGN PATENT DOCUMENTS

| | | |
|---|---|---|
| JP | 08-329694 | 12/1996 |
| JP | 09-180481 | 7/1997 |
| JP | 11-39887 | 2/1999 |
| JP | 2000-21181 | 1/2000 |
| JP | 2001-93287 | 4/2001 |

* cited by examiner

Primary Examiner—Son T. Dinh
(74) Attorney, Agent, or Firm—Arent Fox PLLC

(57) ABSTRACT

It is intended to provide control method and a nonvolatile semiconductor memory device capable of erase operation or write operation in high speed securing reliability without applying excessive electric field. An operation unit consists of a plurality of operation cycles each of which has a bias-application period and a verification period. Addition voltage ΔV is added to each operation unit as bias voltage, whereby a write operation can be carried out with characteristic of injected current IFG that is uniform among respective operation units duration of which are generally same. In this case, duration of operation cycles are shortened by each operation unit and duration of verification periods are shortened so as to avoid a situation such that a write operation completes in the middle of a bias-application period and after that, another write operation continues to cause excessive voltage stress on non-volatile semiconductor memory cells.

22 Claims, 7 Drawing Sheets

CIRCUIT BLOCK DIAGRAM OF NON-VOLATILE SEMICONDUCTOR MEMORY DEVICE DIRECTED TO FOURTH EMBODIMENT

CONCEPTUAL DIAGRAM ILLUSTRATING ERASE OPERATION OF NON-VOLATILE SEMICONDUCTOR MEMORY CELL

CONCEPTUAL DIAGRAM ILLUSTRATING WRITE OPERATION OF NON-VOLATILE SEMICONDUCTOR MEMORY CELL

WAVEFORM DIAGRAM DIRECTED TO FIRST EMBODIMENT

WAVEFORM DIAGRAM DIRECTED TO VARIANT OF FIRST EMBODIMENT

FIG. 5  WAVEFORM DIAGRAM DIRECTED TO SECOND EMBODIMENT

WAVEFORM DIAGRAM DIRECTED TO THIRD EMBODIMENT

FIG. 7 CIRCUIT BLOCK DIAGRAM OF NON-VOLATILE SEMICONDUCTOR MEMORY DEVICE DIRECTED TO FOURTH EMBODIMENT

WAVEFORM DIAGRAM DIRECTED TO RELATED ART

CONTROL METHOD OF NON-VOLATILE SEMICONDUCTOR MEMORY CELL AND NON-VOLATILE SEMICONDUCTOR MEMORY DEVICE

CROSS-REFERENCE TO RELATED APPLICATIONS

This application is based upon and claims the benefit of priority from each of the prior Japanese Patent Application No. 2002-274753 filed on Sep. 20, 2002, the entire contents of which are incorporated herein by reference.

BACKGROUND OF THE INVENTION

1. Field of the Invention

The present invention relates to erase operation or write operation to a non-volatile semiconductor memory cell, more particularly, it relates to control method and a non-volatile semiconductor memory device capable of erase operation or write operation in high speed securing reliability.

2. Description of Related Art

Japanese Laid-open Patent Publication No. 11-39887 discloses a non-volatile semiconductor memory device that intends to shorten write operation time or the like. More particularly, the non-volatile semiconductor memory device improves ISPP method that raises pulse voltage by each applied cycle with respect to write pulse waveform so as to change pulse width as well as pulse voltage.

After a write operation is started, there occurs a write pulse SP1 having a width of TPW1 and voltage of VW1 at first. In the second write operation, there occurs a write pulse SP2 having a width of TPW2 and voltage higher than VW1 by $\Delta V1$ of step voltage.

It is also possible for the non-volatile semiconductor memory device to have structure such that a predetermined number of pulses that follow the second one have a second width and after the predetermined number of pulses, following pulses have a third width that is shorter than the second pulse. A pulse waveform of such a case is shown in FIG. 8. FIG. 8 shows that a predetermined number for the second width is two and a predetermined number for the third width is three. The second and third pulses have a second width TP200 and the fourth pulses have a third width TP300. Since the reference No. 11-39887 is an improvement of ISPP method, pulse voltage becomes higher for every applied cycle.

Japanese Laid-open Patent Publication No. 8-329694 discloses a non-volatile semiconductor memory device that intends to conduct high-speed data write operation. In the non-volatile semiconductor memory device, write operation time takes a constant time t until write voltage VPP reaches VPPmax, a maximum value of it. When write voltage VPP reaches its maximum value VPPmax by raising write voltage by $\Delta$VPP for each write operation, data write operations after reaching VPPmax are made longer to be $T(n)=4\times T(n-1)$ keeping the predetermined value VPPmax. Since write voltage VPP is restricted, threshold voltage transition to a memory cell for next write operation is made still larger by changing write operation time.

No. 11-39887 discloses a non-volatile semiconductor memory device that intends to shorten write operation time or the like. For erase operations and write operations to a floating gate of a non-volatile semiconductor memory, tunnel current for an erase operation and hot electron current for a write operation flow depending on an electric field between a floating gate and a source or channel region that is obtained when pulse voltage is applied. An electric field generated by increased voltage from pulse voltage of a preceding cycle is added to remaining electric field, whereby level of an electric field to be applied comes to its maximum. After that, as ejection of charges from a floating gate (case of erase operation) and injection of charges to a floating gate (case of write operation) go on, an electric field becomes relaxed. Accordingly, current waveform shows transition such that tunnel current and hot electron current in their maximum levels flow when pulse voltage is applied and after reaching the maximum, the current lowers.

As shown in FIG. 8, the prior art directed to No. 11-39887 is to raise pulse voltage by each pulse and to shorten pulse width by a predetermined number of pulses while pulse voltage is made higher. While to-be-applied electric field is relaxed by tunnel current along with a predetermined declined waveform, there occurs a phenomenon that as pulse voltage becomes higher by each pulse, pulse width decreases by each pulse. That is, a new pulse waveform adds a new electric field under the situation that tunnel current or the like remains flowing in case decrease of a pulse width and to-be-applied electric field remains.

Above such situation means to add a new electric field in advance at a stage where tunnel current flows and an erase operation and the like continues. That is, this is to apply excessive electric field to a non-volatile semiconductor memory cell, which is problematic in terms of device reliability.

Needless to say, for an erase operation to a non-volatile semiconductor memory device, an electric field should be applied within a range that does not reach gate destructive voltage or the like. In the prior art directed to No. 11-39887, a to-be-applied electric field is added by each pulse. Accordingly, it is necessary to restrict a to-be-applied electric field at an initial stage of an erase operation or the like within a range of device resistibility against high voltage. Therefore, tunnel current or the like is restricted at an initial stage of an erase operation or the like. As a result, an erase operation cannot be conducted efficiently.

Furthermore, the prior art directed to No. 8-329694 is intended to achieve high-speed data write. After write voltage VPP reaches its maximum voltage VPPmax, time for write operation is taken longer so as to surely conduct each write operation.

However, each time for data-write becomes longer at latter stages that are nearly end of a write operation. In case a data-write finishes in the middle of a write period, even after the end of the data-write, unnecessary electric field is continuously applied until the write period terminates. This is problematic in terms of device reliability.

SUMMARY OF THE INVENTION

The present invention has been made to solve at least one of the above described problems. Accordingly, it is an object of the present invention to provide control method and a non-volatile semiconductor memory device capable of erase operation or write operation in high speed securing reliability without applying excessive electric field.

To achieve the object, according to first aspect of the present invention, there is provided Control method of a non-volatile semiconductor memory cell an operation cycle of which consists of a bias-application period for applying bias voltage for data-erase or data-write and a verification period for making a result verification after termination of the bias-application period, and pluralities of the operation cycles of which are repeated for erase operation and write operation to the non-volatile semiconductor memory cell, the control method comprising steps of: bias adjustment step where the bias voltage becomes deeper by increment of operation unit including at least one operation cycle along with progress of the erase operation or the write operation and duration of the operation unit is controlled to have positive correlation to voltage difference of preceding operation unit and the bias voltage; and verification step where the operation cycle becomes shortest at a stage near end of the erase operation or the write operation.

In the control method of a non-volatile semiconductor memory cell directed to the first aspect of the present invention, as the bias adjustment step, same level of bias voltage is applied to operation units each of which consists of one or more operation cycle(s) and deeper bias voltage is applied when operation units are switched. Duration of a operation unit is set having positive correlation to increased voltage difference of bias voltage between operation units. That is, in case increased voltage difference of bias voltage is large, duration of an operation unit where bias voltage is increased becomes long whereas in case increased voltage difference of bias voltage is small, duration of an operation unit where bias voltage is increased becomes short. Furthermore, in the verification step, an interval for a verification period is shortened to make an operation cycle at a stage near end of erase operation or write operation shortest.

Thereby, duration of an operation unit after bias voltage increased is determined having positive correlation to increased voltage difference of bias voltage. Accordingly, duration of an operation unit can be set along with time that erase current or write current flows due to to-be-applied electric field to a semiconductor memory cell depending on increased voltage difference. Bias voltage can be further applied at a stage where current decreases and remaining electric field lowers, without the to-be-applied electric field being added to remaining electric field. An erase operation or a write operation can be realized efficiently while device reliability at the beginning is secured.

Erase current or write current for to-be applied electric field is determined to be a single value having positive correlation. Therefore, in case large electric field is applied due to application of bias voltage having large increased voltage difference, time of current effective for data-erase or data-write flowing becomes longer. By making duration of an operation unit longer, current effective until to-be-applied electric field lowers can be let flow continuously. Furthermore, in case small electric field is applied due to application of bias voltage having small increased voltage difference, time of current effective to data-erase or data-write flowing becomes short. Duration of an operation unit is shortened so shift from the current operation unit to the following operation unit can be carried out along with decrease of current due to lowering of to-be-applied electric field. In any cases, bias voltage is further applied along with lowering of to-be-applied electric field. That is, without to-be-applied electric field being added, erase or write operation can be conducted in high speed having high reliability.

Furthermore, at a termination of an erase operation or a write operation, an interval of a verification period is shortened. Therefore, verifications can be made frequently at a stage where erase operation or write operation comes near its termination and application of bias voltage can be stopped at a termination of an erase operation or a write operation. Thereby, reliability deterioration due to unnecessary electric field stress can be suppressed without continuous application of unnecessary bias voltage after end of an operation.

At the beginning of an operation unit, to-be-applied electric field remaining in a non-volatile semiconductor memory cell has lowered. Accordingly, electric field that can be applied at the beginning of an operation unit can be constantly made maximum within a voltage range where an device can cope with. Thereby, erase current or write current for each operation unit can be made maximum to conduct high-speed operation.

According to second aspect of the present invention, there is provided Control method of a non-volatile semiconductor memory cell an operation cycle of which consists of a bias-application period for applying bias voltage for data-erase or data-write and verification period for making a result verification after termination of the bias-application period, and pluralities of the operation cycles of which are repeated for erase operation and write operation to the non-volatile semiconductor memory cell, the control method comprising steps of: first bias adjustment step where, during a first predetermined period that begins with start of either the erase operation or the write operation, the bias voltage becomes deeper by increment of operation unit including at least one operation cycle along with progress of the erase operation or the write operation and duration of the operation unit is controlled to have positive correlation to voltage difference of preceding operation unit and the bias voltage; and second bias adjustment step where, during a second predetermined period that comes near with end of either the erase operation or the write operation, the bias voltage becomes deeper by increment of operation unit including at least one operation cycle along with progress of the erase operation or the write operation and duration of operation unit is controlled to be short compared with adjustment time taken by the first bias adjustment step.

In the control method of a non-volatile semiconductor memory cell directed to the second aspect of the present invention, the first bias adjustment step works such that, during a first predetermined period that begins with start of an erase operation or a write operation, same level of bias voltage is applied to operation units each of which consists of one or more operation cycle(s) and deeper bias voltage is applied when operation units are switched. Duration of an operation unit is set having positive correlation to increased voltage difference of bias voltage between operation units. The second adjustment step works such that, during a second predetermined period that comes near the termination of an erase operation or a write operation, deeper bias voltage is applied when operation units are switched and duration of an operation unit is set shorter than time to be adjusted at the first bias adjustment step.

According to third aspect of the present invention, there is provided control method of a non-volatile semiconductor memory cell an operation cycle of which consists of a bias-application period for applying bias voltage for data-erase or data-write and verification period for making a result verification after termination of the bias-application period, and pluralities of the operation cycles of which are repeated for erase operation and write operation to the non-volatile semiconductor memory cell, the control method comprising steps of: first bias adjustment step where, during a first predetermined period that begins with start of either the erase operation or the write operation, the bias voltage becomes deeper by increment of operation unit including at least one operation cycle along with progress of the erase operation or the write operation and duration of the operation unit is controlled to have positive correlation to voltage difference of preceding operation unit and the bias voltage; and third bias adjustment step where, during a third predetermined period that comes near with end of either the erase operation or the write operation, voltage difference of the bias voltage between operation units including at least one the operation cycles becomes deeper than voltage difference of the bias voltage in the first bias adjustment step.

In the control method of a non-volatile semiconductor memory cell directed to the third aspect of the present invention, the first bias adjustment step works such that, during a first predetermined period that begins with start of an erase operation or a write operation, same level of bias voltage is applied to operation units each of which consists of one or more operation cycle(s) and deeper bias voltage is applied when operation units are switched. Duration of an operation unit is set having positive correlation to increased voltage difference of bias voltage between operation units. The second adjustment step works such that, during a second predetermined period that comes near termination of an erase operation or a write operation, voltage difference of the bias voltage between operation units becomes deeper than voltage difference of the bias voltage in the first bias adjustment step.

A first predetermined period is a predetermined period that begins with start of an erase operation or a write operation. This period is provided to secure device reliability suppressing application of bias voltage at the beginning of an erase operation or a write operation to a minimum essential. A second predetermined period is a predetermined period that comes near termination of an erase operation or a write operation. This period is provided to finish an erase operation or a write operation in short time by accelerating bias state while securing device reliability.

Thereby, during a first predetermined period that starts at the beginning of an erase operation or a write operation, duration of an operation unit can be set along with time of effective current flowing by to-be-applied electric field to an device, which depends on increased voltage difference of bias voltage between operation units. Thereby, an erase operation or a write operation can be conducted efficiently with device reliability being secured. Furthermore, at the end of an erase operation or a write operation, to-be-applied electric field is added by applying deeper bias voltage at a stage where to-be-applied electric field remains and it is before current due to to-be-applied electric field lowers to a predetermined current value. An erase operation or a write operation can be accelerated by increasing current due to addition of to-be-applied electric field. An erase operation or a write operation in high-speed can be realized while device reliability at the beginning is secured.

According to fourth aspect of the present invention, there is provided a non-volatile semiconductor memory device for conducting erase operation or write operation to a non-volatile semiconductor memory cell by repeating an operation cycle of which consists of a bias-application period to apply bias voltage for data-erase or data-write and a verification period to make a result verification after termination of the bias-application period, the non-volatile semiconductor memory device comprising: a control parameter setting section for setting a control parameter for the erase operation or the write operation; and a control section for controlling the erase operation or the write operation in accordance with the control parameter from the control parameter setting section.

In the non-volatile semiconductor memory device directed to the fourth aspect of the present invention, control parameter for an erase operation or a write operation is set in the control parameter setting section and control section controls an erase operation or a write operation along with a control parameter.

Thereby, there can be set a control parameter for high-speed operation time of an erase operation or a write operation depending on device characteristics of non-volatile semiconductor memory cells or the like in a non-volatile semiconductor memory device while device reliability is secured. Since optimum erase operation or write operation can be set along with an device characteristic, a yield of characteristic tests for non-volatile semiconductor memory devices can be enhanced.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Preferred embodiments of an inventive control method of a non-volatile semiconductor memory cell and a non-volatile semiconductor memory will be described in detail below with reference to FIG. 1 through FIG. 7.

Figure 1:
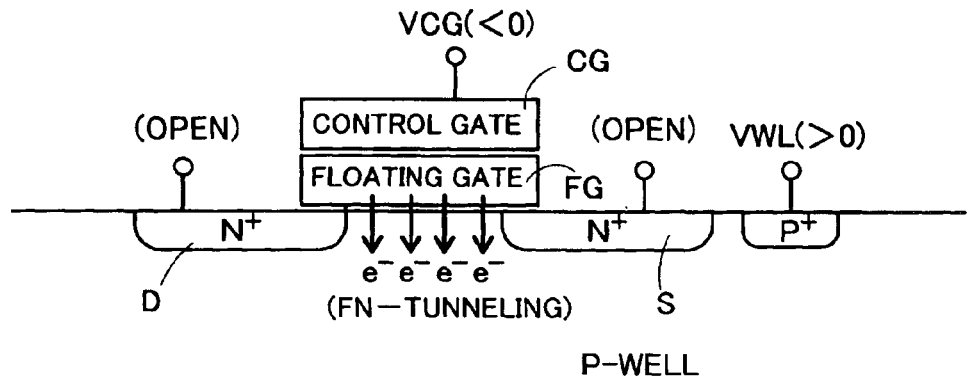
FIG. 1 is a conceptual diagram illustrating erase operation of a non-volatile semiconductor memory cell.
Figure 2:
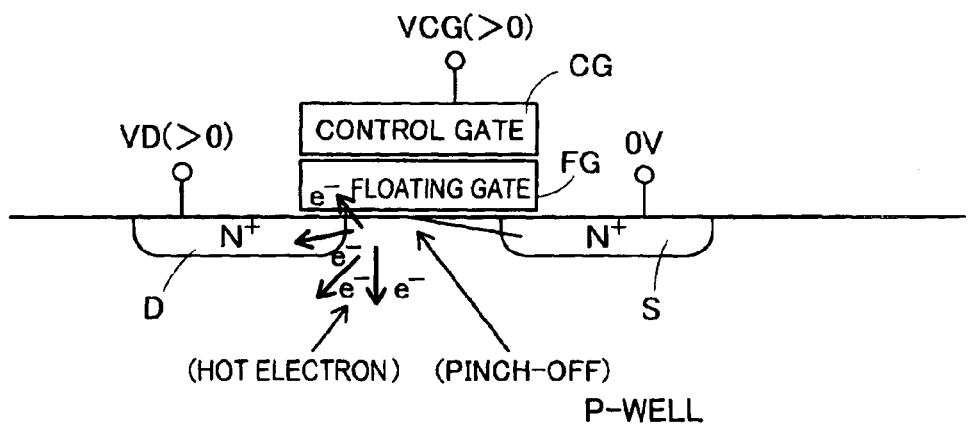
FIG. 2 is a conceptual diagram illustrating write operation of a non-volatile semiconductor memory cell.

FIG. 1 and FIG. 2 are conceptual diagrams showing cross sectional views of a non-volatile semiconductor memory cell and illustrating state of bias voltage and movement of charges during erase operation and write operation, respectively.

FIG. 1 illustrates an erase operation. More specifically, it shows an erase operation carried out by a manner such that charges are ejected due to FN-tunneling current that flows from a floating gate terminal FG to a channel region below the floating gate terminal FG. That is, this shows a case of channel erase. Well voltage VWL (>0V) of positive voltage is applied to a P-type well region that constitutes the channel region whereas control gate voltage VCG (<0V) of negative voltage is applied to a control gate CG. A source terminal S and a drain terminal D are kept in floating state.

In a non-volatile semiconductor memory cell, well voltage VWL (>0V) of positive voltage and control gate voltage VCG (<0V) of negative voltage serve to apply electric field toward the control gate terminal CG through the channel region and the floating gate terminal FG. The floating gate FG is biased to predetermined potential by the electric field. When the electric field exceeds a predetermined electric field value, FN-tunneling current flows through a gate oxide film.

Charges stored in the floating gate terminal FG pass through the gate oxide film and reach the channel region due to FN-tunneling phenomenon. Charges reaching there flow out due to well voltage VWL. When charges flow out, potential of the floating gate terminal FG rises whereas electric field to be applied to the channel region decreases. When FN-tunneling current decreases along with decrease of electric field to be applied and electric field reach the predetermined electric field value. Tunneling current stops flowing and erase operation stops. In case further erase operation is to be continued from this situation, still deeper bias voltage needs applying to make electric field to be applied same as or higher than the predetermined electric field value.

FIG. 2 illustrates write operation. More specifically, it shows a write operation carried out by injecting charges wherein hot electron current flowing from a channel region near a drain terminal D to a floating gate terminal FG serves for charge injection. When voltage level of a source terminal S is set to reference voltage (0V), drain voltage VD (>0V) of positive voltage is applied to a drain terminal D and control gate voltage VCG (>0V) of positive voltage is applied to a control gate terminal CG.

Potential balance between control gate voltage VCG and drain voltage VD both of which are positive voltage keeps a non-volatile semiconductor memory cell in operation state of a saturation region. That is, the non-volatile semiconductor memory cell is kept in biased state to generate a pinch-off point at a predetermined position within a channel region. High electric field toward the pinch-off point from the drain terminal D accelerates movement of charges (in this case, electrons) toward the drain terminal D to generate hot electrons near the drain terminal D. On the other hand, electric field is applied to a portion between the control gate terminal CG and the channel region. The floating gate terminal FG is also biased to predetermined potential by the electric field. When the electric field exceeds its predetermined electric field value, generated hot electrons are injected to the floating gate terminal FG through a gate oxide film. The hot electrons flow as so-called hot electron current.

Electrons are injected to the floating gate terminal FG through the gate oxide film due to hot electron current. The injected electrons are observed as current from control gate voltage VCG. When electrons are injected, potential at the floating gate terminal FG drops and electric field to be applied to the channel region decreases. As electric field to be applied decreases, hot electron current decreases, as well. When the electric field reaches its predetermined electric field value, hot electron current stops flowing and write operation stops. In case further write operation is to be continued from this situation, still deeper bias voltage needs applying to make electric field to be applied same as or higher than the predetermined electric field value.

Figure 3:
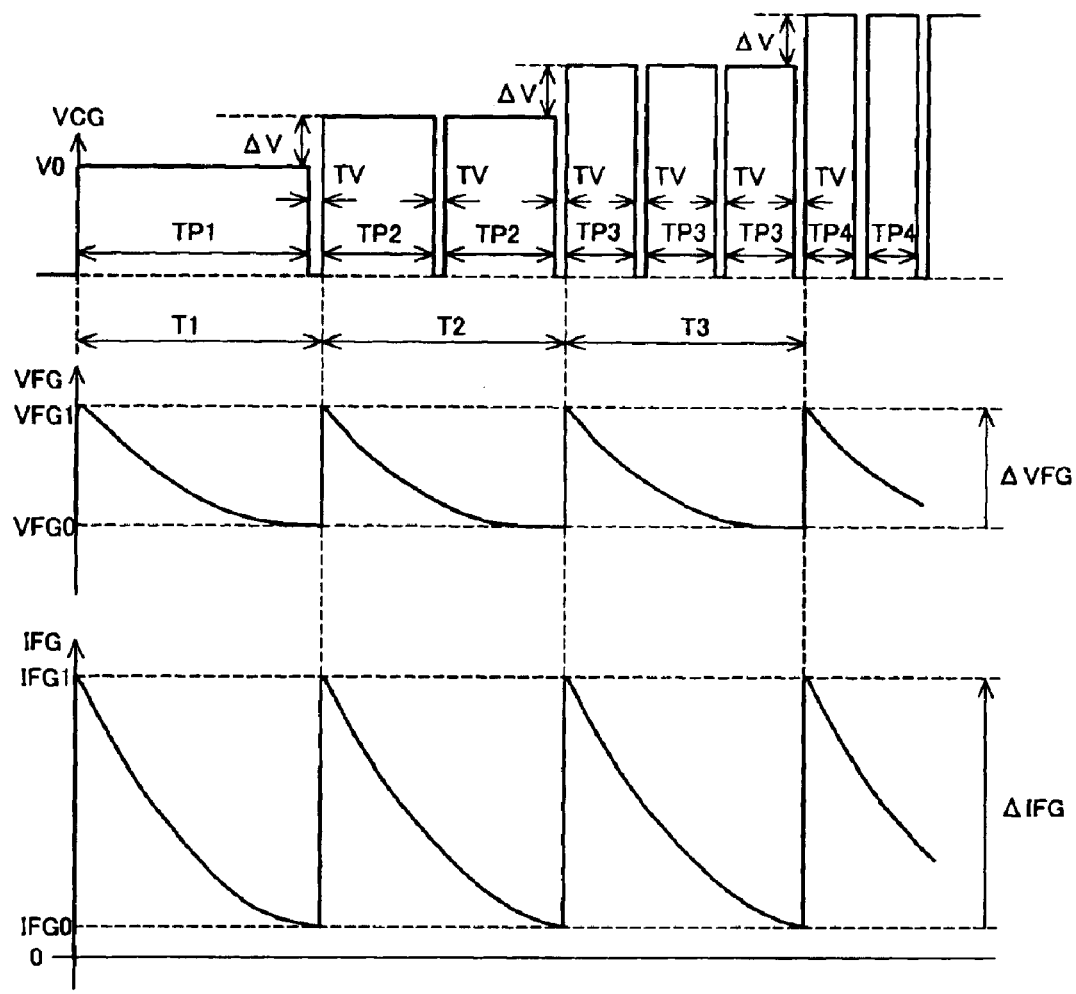
FIG. 3 is a waveform diagram directed to first embodiment.

FIG. 3 is a waveform diagram showing bias state of a write operation (FIG. 2) directed to the first embodiment. An operation cycle consists of a bias-application period and verification period. A write operation (FIG. 2) is conducted by repeating the above operation cycles. The first embodiment describes a control method in case characteristics of injected current IFG to the floating gate terminal FG are equivalent by each operation unit.

The control gate terminal CG is biased to bias voltage VCG of positive voltage during bias application periods TP1 through TP4. Positive voltage is induced to the floating gate voltage VFG due to capacity coupling and subsequently, electric field is applied to a point between the floating gate and the channel region. This electric field accelerates movement of hot electrons generated near the drain terminal D. As a result, hot electrons are injected to the floating gate terminal FG and injected current IFG flows.

A verification period TV is provided as a period for conducting normal read operation where a result of write operation at the bias application periods TP1 through TP4 is verified and application of bias voltage VCG is cancelled at the beginning of a verification period TV. Accordingly, floating gate voltage shifts to voltage level of normal read state from voltage VFG0 and at the same time, injected current IFG0 does not flow. However, for the convenience of simple description, operational waveform of a verification period TV is left out in FIG. 3.

As a write operation starts, a first operation unit T1 starts, as well. The first operation unit T1 is one operation cycle consisting of a bias-application period TP1 and a verification period TV. In a bias-application period TP1, initial voltage V0 is applied as initial bias voltage VCG to control gate terminal CG (VCG=V0). Voltage of floating gate voltage VFG=VFG1 is induced at the floating gate terminal FG due to capacity coupling or the like caused by application of the bias voltage VCG=V0. Hot electrons are injected by electric field to be applied which is due to floating gate voltage VFG=VFG1. As a result, injected current IFG=IFG1 flows.

As bias is applied, voltage level of floating gate voltage VFG1 to be applied to the floating gate terminal FG gradually drops due to injection of hot electrons. Thereby, electric field to be applied to a point between the floating gate terminal FG and the channel region gradually drops and current level of injected current IFG gradually drops from the level of current IFG=IFG1. When injected current IFG reaches its predetermined current value IFG0, a bias application period TP1 terminates. Floating gate voltage VFG at this point is VFG0.

The predetermined current value IFG0 herein indicates a limiting value where injection efficiency of hot electrons drops and efficient write operation cannot be conducted. Write operation efficiency is poor when injected current is same as or lower than the predetermined current value IFG0. In case a write operation is conducted with such level of injected current, it takes significantly long to complete a write operation. In other words, a bias-application period TP1 is set as a period where write operation by applying bias voltage VCG=V0 is effective.

Subsequent to termination of a bias-application period TP1, a verification period TV starts. In a verification period TP1, data is read out from a write cell to verify whether or not write operation completes. A normal read operation takes significantly short time compared with a write operation. Therefore, verification period takes significantly short.

A second operation unit T2 to be executed subsequently has two operation cycles each of which consists of a bias-application period TP2 and a verification period TV. In a bias-application period TP2, voltage equivalent to initial voltage V0 at a first operation unit plus addition voltage ΔV is applied as initial bias voltage VCG to control gate terminal VCG (VCG=V0+ΔV). When capacity coupling occurs due to the bias voltage VCG, voltage is induced at the floating gate terminal FG. Voltage V0 out of bias voltage VCG has only an effect to return floating gate voltage VFG to voltage VFG0 obtained at a termination point of a first operation unit T1. This is because the bias voltage V0 and voltage shift of bias voltage VCG at the time of shifting to a verification period TV are same in voltage value but their voltage transition direction are opposite to each other.

It is addition voltage ΔV that is added to bias voltage VCG for inducing floating gate voltage VFG1 that helps hot electrons to be injected to the floating gate terminal FG during a second operation unit T2. Level of addition voltage ΔV to be added to a first operation unit TP1 is adjusted as bias voltage VCG so as to set level of floating gate voltage VFG to same level as voltage VFG1 in a first operation unit TP1. Thereby, write operation can be executed in a second operation unit with characteristic of injected current IFG equivalent to a first operation unit. Furthermore, there are two times of verification period TV in a second operation unit T2, so a second operation unit T2 has verification period as twice long as a first operation unit T1. Since time needed for a verification period TV is significantly short, time for injected current IFG to reach predetermined injected current value IFG0 is equal in a first operation unit and a second operation unit (T1≈T2).

In a second operation unit T2, a bias-application period TP2 is shorter by generally half than a bias-application period TP1 in a first operation unit T1 and at an intermediate point of the second operation unit T2, a verification period TV is provided. Since a write operation goes on in a second operation unit T2 that follows a first operation unit T1, it is preferable that a verification of write operation state is made every shorter bias-application period TP2. Therefore, there can be avoided a situation such that a write operation completes in the middle of a long bias application period and a subsequent write operation becomes excessive voltage stress to non-volatile semiconductor memory cells.

A third operation unit T3 to be executed subsequently has three operation cycles each of which consists of a bias application period TP3 and a verification period TV. In a bias-application period TP3, addition voltage ΔV is additionally applied as bias voltage VCG to control gate terminal CG (VCG=V0+ΔV+ΔV). Addition voltage ΔV to be further applied can induce floating gate voltage VFG1 that helps hot electrons to be injected to the floating gate terminal FG. Addition voltage ΔV equivalent to addition voltageΔV at a second operation unit TP2 is applied at a third operation unit TP3, whereby floating gate voltage VFG can be set to voltage VFG1 that is same at both a first operation unit T1 and a second operation unit T2.

Furthermore, in a third operation unit T3, a bias-application period TP3 is shorter by generally one-third than a bias-application period TP1 in a first operation unit T1 and three times of verification period TV are provided in three times of bias-application periods TP3. Since write operation further goes on in a third operation unit T3, a verification of write operation state is made every still shorter bias-application period TP3. Therefore, there can be avoided a situation such that a write operation completes in the middle of a long bias application period and subsequent write operation becomes excessive voltage stress to non-volatile semiconductor memory cells.

In operation units following a fourth operation unit, addition voltage ΔV is added as bias voltage VCG by increment of each operation unit, whereby generally constant duration of an operation unit makes it possible to conduct write operation with characteristic of injected current IFG equivalent to each operation unit. In this case, duration of an operation cycle is shortened by a bias-application period and a cycle of a verification period is shortened as well. Thereby, there can be avoided a situation such that a write operation completes in the middle of a long bias application period and subsequent write operation becomes excessive voltage stress to non-volatile semiconductor memory cells. In an operation unit immediately before completion of write operation, length of the operation cycle is set to the shortest among all of operation cycles taken for a write operation so as to complete write operation in almost same timing with completion of data-write.

It has been described that duration of respective operation units T1 through T3 is generally same and characteristic of injected current IFG at respective operation units T1 through T3 is equivalent. However, it is possible to set a sum of duration of bias-application periods in respective operation unit T1 through T3 equal. Thereby, actual write operation time in an operation unit can be made equivalent in each operation unit. As a result, addition voltage ΔV is equal among respective operation units and characteristic of injected current IFG among respective operation units can be made equivalent.

Figure 4:
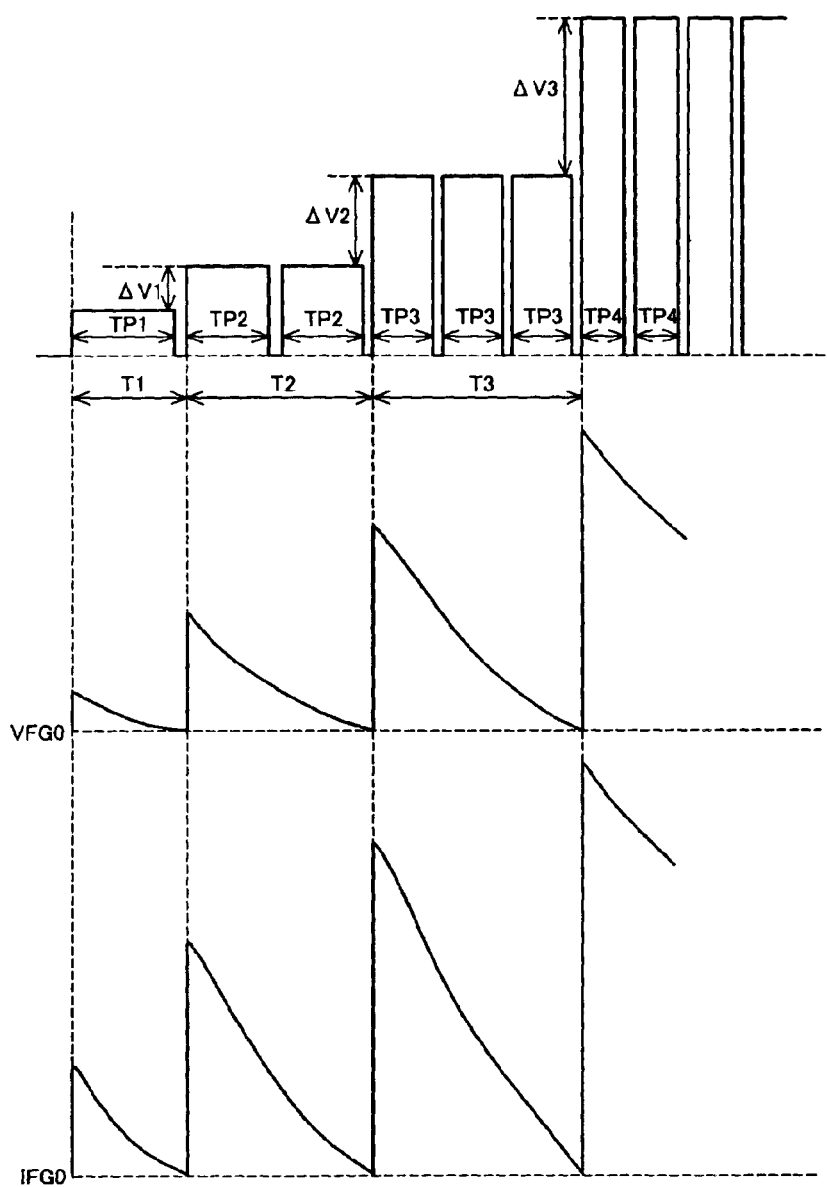
FIG. 4 is a waveform diagram directed to variant of first embodiment.

FIG. 4 is a waveform diagram showing bias state of a write operation (FIG. 2) directed to a variant of the first embodiment. Instead of the waveform diagram (FIG. 3) of the first embodiment, the variant is structured such that addition voltage to bias voltage VCG to be applied to the control gated terminal CG becomes larger voltage difference by increment of operation unit. That is, addition voltage ΔV2, voltage difference from a second operation unit to a third operation unit, is larger than addition voltage ΔV1, voltage difference from a first operation unit T1 to the second operation unit T2 (ΔV1<ΔV2) and furthermore, addition voltage ΔV3, voltage difference from the third operation unit to a fourth operation unit, is larger than the addition voltage ΔV2 (ΔV1<ΔV2<ΔV3). In addition to it, duration of an operation unit is set long by operation unit depending on voltage difference, i.e., level of addition voltage ΔV1 through ΔV3. Thereby, floating gate voltage VFG to be applied to the floating gate terminal FG at the beginning of each operation unit is set larger by increment of operation unit and injected current IFG comes to a predetermined current value IFG0 at the end of each operation unit. As bias voltage VCG of which voltage difference between succeeding two operation units becomes larger in order by increment of operation unit, electric field becoming larger by increment of operation unit is applied and current effective to erase or write operation becomes larger, whereby duration of an operation unit become longer and current effective until lowering of application electric field can flow continuously.

Figure 5:
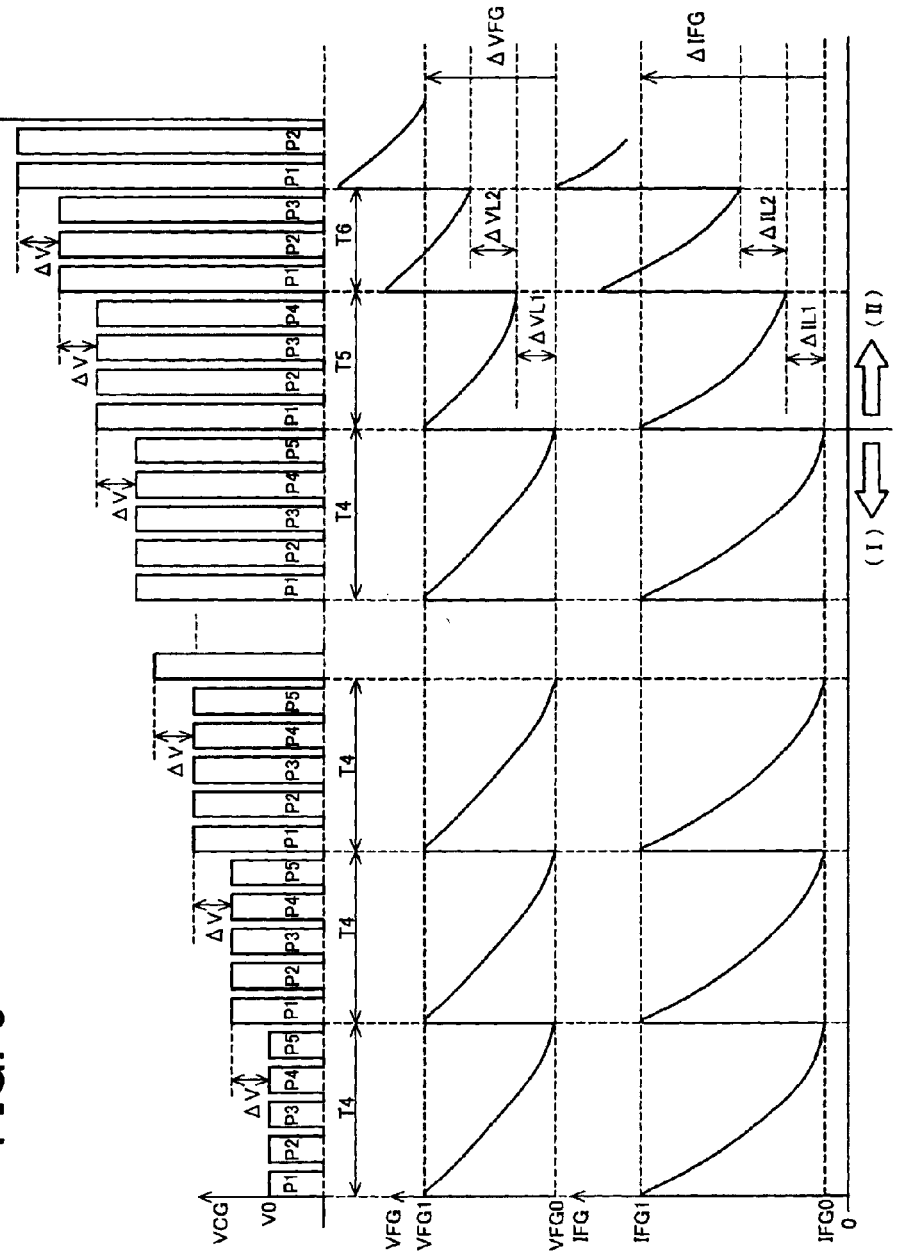
FIG. 5 is a waveform diagram directed to second embodiment.

FIG. 5 is a waveform diagram showing bias state during write operation (FIG. 2) directed to the second embodiment. An operation cycle consists of a bias-application period and a verification period. Repetition of operation cycles makes a write operation of FIG. 2. A method of controlling duration of operation unit will be described in the second embodiment where characteristic of injected current IFG to the floating gate FG is to be uniform by each operation unit during a first predetermined period that starts from a beginning of a write operation whereas current injection quantity is increased by each operation unit to accelerate a write operation during a second predetermined period that reaches termination of a write operation.

A first predetermined period is a predetermined length of period that starts from a beginning of a write operation as well as a period to secure reliability of structural devices by suppressing degree of bias voltage VCG application to a minimum essential at the beginning of a write operation. A period indicated with (I) in FIG. 5 corresponds to a first predetermined period. Furthermore, a second predetermined period is a predetermined length of period that starts from the end of a first predetermined period and ends with termination of a write operation as well as a period provided to complete a write operation in a short time by accelerating bias state with securing reliability of structural devices. A period indicated with (II) in FIG. 5 corresponds to a second predetermined period.

Similar to the case of FIG. 3, operational waveform of floating gate voltage VFG and that of injected current IFG in the verification period are left out to simplify explanation.

Similar to the first embodiment, addition voltage ΔV starting with V0 is incrementally added to bias voltage VCG between succeeding operation units in the second embodiment. Furthermore, duration of an operation unit after beginning of a write operation in a first predetermined period is T4 and this is equal with duration of an operation unit in the first embodiment.

Different from the first embodiment, duration of respective operation cycle is constant irrespective of the number of operation units and the duration is equivalent to shortest duration at an operation unit immediately before completion of a write operation in the second embodiment. Furthermore, duration of respective operation units in a second predetermined period that reaches termination of a write operation is shortened by each operation unit. For shortening duration, the number of operation cycles in respective operation unit is reduced.

The former half of a write operation is constituted by operation units each of which consists of operation cycles P1 through P5 and duration of respective operation units are same. Additionally, bias voltage VCG between succeeding two operation units increases taking voltage difference of addition voltage ΔV. Accordingly, floating gate voltage VFG to be induced at the floating gate terminal FG becomes voltage VFG1 that is same at each operation unit, and injected current IFG due to floating gate voltage VFG1 becomes current IFG1 that is same at each operation unit. Furthermore, since duration of respective operation units are same, a write operation is conducted with injected current IFG characteristic of which is same among operation units.

Accordingly, at the former half of a write operation, a write operation equivalent to a write operation of the first embodiment is conducted.

At the latter half of a write operation, the number of operation cycles is decreased per operation unit thereby to shorten duration of an operation unit. For example, duration of an operation unit T6 that has three operation cycles P1 through P3 is one-cycle shorter than that of an operation unit T5 that has four operation cycles P1 through P4.

On the other hand, bias voltage VCG increases by addition voltage ΔV per operation unit, which is similar to the former half of a write operation and an increase of floating gate voltage VFG to be induced at the beginning of an operation unit becomes voltage ΔVFG(VFG1−VFG0). An increase of injected current IFG due to the above becomes current ΔIFG (IFG1−IFG0).

Duration is shortened by each operation unit, whereby an increase of injected current ΔIFG due to an increase of floating gate voltage ΔVFG does not flow during duration of an operation unit. Accordingly, when a next operation unit starts, remaining voltage ΔVL1 remains in floating gate voltage VFG and remaining current ΔIL1 flows as injected current IFG. A new operation unit starts under such a condition, and bias voltage VCG to which addition voltage ΔV is applied. As a result, an increase of floating gate voltage VFG and that of injected current IFG are ΔVFG+ ΔVL1, and ΔIFG+ΔIL1, respectively. That is, remaining voltage ΔVL1 and remaining current ΔIL1 are added to VFG and IFG, respectively.

With respect to an operation unit newly started, duration of it is further shortened. Therefore, remaining voltage ΔVL2 and remaining current ΔIL2 larger than remaining voltage ΔVL1 and remaining current ΔIL1, respectively, remain. Accordingly, in a further next operation unit, there is induced further larger floating gate voltage VFG to which remaining voltage ΔVL1+VL2 is added and there flows further larger injected current IFG to which remaining current ΔIL1+ΔIL2 is added. In the latter half of a write operation, there flows injected current IFG that becomes larger by each operation unit to accelerate the write operation.

It is described that as addition voltage for each operation unit, a constant level of voltage ΔV is added in order by increment of operation unit in the second embodiment. However, as the variant of the first embodiment (FIG. 4) shows, it is possible to add addition voltage that becomes larger in order by increment of operation unit. In such a case, aspects of the variant of the first embodiment can be applied to any predetermined periods, i.e. regardless of first predetermined period (I), second predetermined period (II) or other, and otherwise the aspects of the variant can be applied to the first predetermined period only.

Furthermore, it is described that an operation cycle consists of bias application periods and a verification period in the second embodiment. However, a verification period TV for actually verifying a result of erase or write operation can be allocated to respective operation cycles of all through the first predetermined period (I) and the second predetermined period (II). Furthermore, such a verification period TV can be allocated to only a period that comes near termination of erase or write operation. In such a case, even though time for verification is secured, a verification operation is actually not conducted with respect to an operation cycle where result verification is not conducted.

Furthermore, the second embodiment illustrates a case that respective operation cycles in the entirety of the first predetermined period (I) and the second predetermined period (II) are constant. What is more, there can be applied structure to shorten operation cycle by increment of operation unit similar to the first embodiment. That is, it is possible to shorten operation cycle by increment of operation unit through the entirety of periods or during periods that come near termination of erase or write operation. Since interval of verification periods is shortened at a termination point of erase or write operation, verifications can be conducted often at a stage where erase or write operation comes near its end and application of bias voltage can be stopped when erase or write operation terminates. Thereby, the above structure can prevent application of unnecessary bias voltage after completion of an operation and deterioration of device reliability due to unnecessary electric field stress can be prevented.

Figure 6:
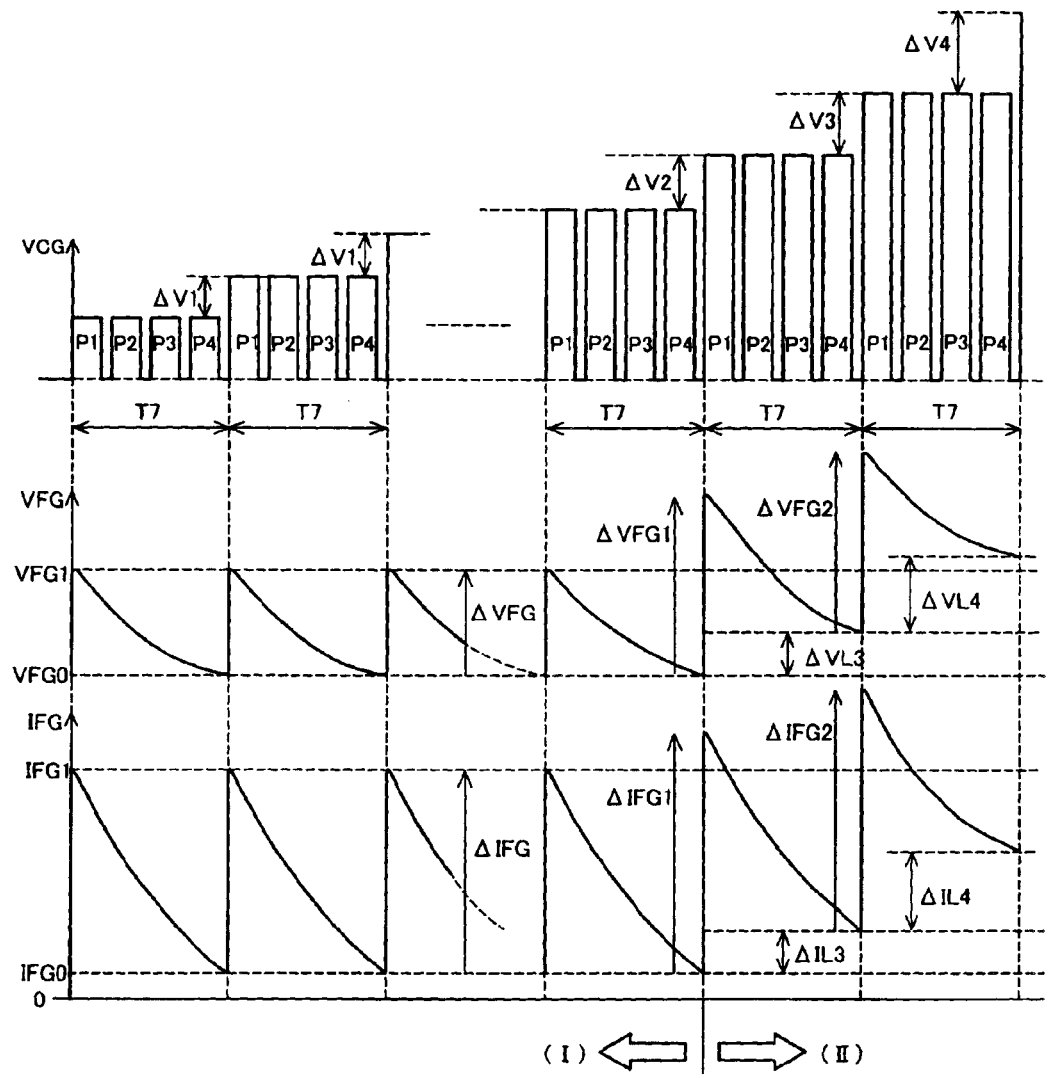
FIG. 6 is a waveform diagram directed to third embodiment.

FIG. 6 is a waveform diagram showing bias state during write operation (FIG. 2) directed to a third embodiment. An operation cycle consists of a bias-application period and verification period. Repetition of operation cycles makes a write operation of FIG. 2. A method of controlling a value of bias voltage VCG between succeeding two operation units will be described in the third embodiment where characteristic of injected current IFG to the floating gate FG is to be equivalent by each operation unit during a first predetermined period that starts from a beginning of a write operation whereas current injection quantity is increased to accelerate write operation during a second predetermined period that reaches termination of a write operation.

A first predetermined period is a predetermined length of period that starts from a beginning of a write operation as well as a period to secure reliability of structural devices by suppressing degree of bias voltage VCG application to a minimum essential at the beginning of a write operation. A period indicated with (I) in FIG. 6 corresponds to a first predetermined period. Furthermore, a second predetermined period is a predetermined length of period that starts from the end of a first predetermined period and ends with termination of a write operation as well as a period provided to complete a write operation in a short time by accelerating bias state with securing reliability of structural devices. A period indicated with (II) in FIG. 6 corresponds to a second predetermined period.

Similar to the case of FIG. 3, operational waveform of floating gate voltage VFG and that of injected current IFG in the verification period are left out to simplify explanation.

Similar to the second embodiment, duration of respective operation cycle is constant irrespective of the number of operation units and the duration is equivalent to shortest duration at an operation unit immediately before completion of a write operation in the third embodiment.

Instead of an aspect of the second embodiment where duration of operation units in the latter half of a write operation are shortened, the third embodiment is structured such that duration of respective operation units are constant and an increase of bias voltage VCG between succeeding two operation units is made large.

The former half of a write operation is a same manner as that of the second embodiment. That is, each of the first and second operation units consists of four operation cycles P1 through P4 and duration of respective operation units are same. Additionally, bias voltage VCG between succeeding two operation units increases taking voltage difference of addition voltage $\Delta V1$. Accordingly, floating gate voltage VFG to be induced at the floating gate terminal FG becomes voltage VFG1 that is same at each operation unit, and injected current IFG due to floating gate voltage VFG1 becomes current IFG1 that is same at each operation unit. Furthermore, since duration of respective operation units are same, a write operation is conducted with injected current IFG characteristic of which is same among operation units.

Each operation unit in the latter half of a write operation has four operation cycles each of which is same in duration. On the other hand, addition voltage to bias voltage VCG between succeeding two operation units becomes larger by operation unit. That is, addition voltage $\Delta V1$ is added to respective operation units in the former half of a write operation whereas addition voltage $\Delta V2$ through $\Delta V4$ added to operation units in order become larger by operation unit ($\Delta 1<\Delta 2<\Delta 3<\Delta 4$) in the latter half.

As bias voltage VCG becomes higher, an increase of floating gate voltage VFG to be induced at the beginning of an operation unit becomes larger than voltage $\Delta VFG$ (VFG1−VFG0) by operation unit. An increase of floating gate voltage VFG due to addition voltage $\Delta V2$ is voltage $\Delta VFG1$ (>$\Delta VFG$). Furthermore, an increase of floating gate voltage VFG due to addition voltage $\Delta V3$ is voltage $\Delta VFG2$ (>$\Delta VFG1$>$\Delta VFG$). An increase of injected current IFG due to the above increases also becomes larger than current $\Delta IFG$ (IFG1−IFG0) and current with reference to voltage $\Delta VFG1$ becomes current $\Delta IFG1$ (>$\Delta IFG$). Furthermore, current with reference to voltage $\Delta VFG2$ becomes current $\Delta IFG2$ (>$\Delta IFG1$>$\Delta IFG$).

When bias voltage VCG with addition voltage $\Delta V2$ lager than addition voltage $\Delta V1$ at a preceding operation unit is added, an increase of voltage $\Delta VFG1$ larger than voltage $\Delta VFG$ at the preceding operation unit is induced at the floating gate terminal FG. Therefore, an increase of injected current $\Delta IFG1$ becomes larger than $\Delta IFG$ at the preceding operation unit. As a result, a value of injected current IFG does not lower to a predetermined current IFG0 when duration T7 of an operation unit terminates. Accordingly, remaining voltage $\Delta VL3$ remains in floating gate voltage VFG and remaining current $\Delta IL3$ flows as injected current IFG when a next operation unit begins. A new operation unit begins with such a condition and bias voltage VCG with further larger addition voltage $\Delta V3$ is applied. An increase of floating gate voltage VFG and that of injected current IFG are $\Delta VFG2+\Delta VL3$, and $\Delta IFG2+\Delta IL3$, respectively. That is, remaining voltage $\Delta VL3$ and remaining current $\Delta IL3$ are added to an increase of addition voltage $\Delta V3$ for bias voltage VCG.

In an operation unit newly started, addition voltage $\Delta V3$ for bias voltage VCG is equivalent to voltage further added to addition voltage $\Delta V2$ at the preceding operation unit. Therefore, there remain new remaining voltage $\Delta VL4$ and remaining current $\Delta IL4$ larger than $\Delta VL3$ and $\Delta IL3$, respectively. Addition voltage for bias voltage VCG increases by each operation unit, whereby remaining voltage in floating gate voltage VFG and remaining current in injected current IFG at termination point of an operation unit become larger operation unit by operation unit. Injected current IFG that becomes larger by each operation unit in the latter half of a write operation to accelerate the write operation.

The third embodiment describes the case such that addition voltage of each operation unit, namely, $\Delta 1$ through $\Delta 4$ become larger by an increment of operation unit ($\Delta 1<\Delta 2<\Delta 3<\Delta 4$), that is, voltage difference becomes larger in order by increment of operation unit. However, as long as addition voltage at a second predetermined period (II) of which voltage difference is larger than addition voltage $\Delta 1$ at a first predetermined period (I) are to be added, addition voltage can be constant in a second predetermined period (II) regardless of increment of operation unit.

Furthermore, similar to the second embodiment, verification period TV for actually verifying a result of erase or write operation and periods of operation cycle that constitute an operation unit can be changed.

Furthermore, the third embodiment describes the case such that duration of an operation unit in a second predetermined period (II) is same as duration of an operation unit in a first predetermined period (I). However, similar to the second embodiment, duration of operation units can be shortened by increment of operation unit.

Figure 7:
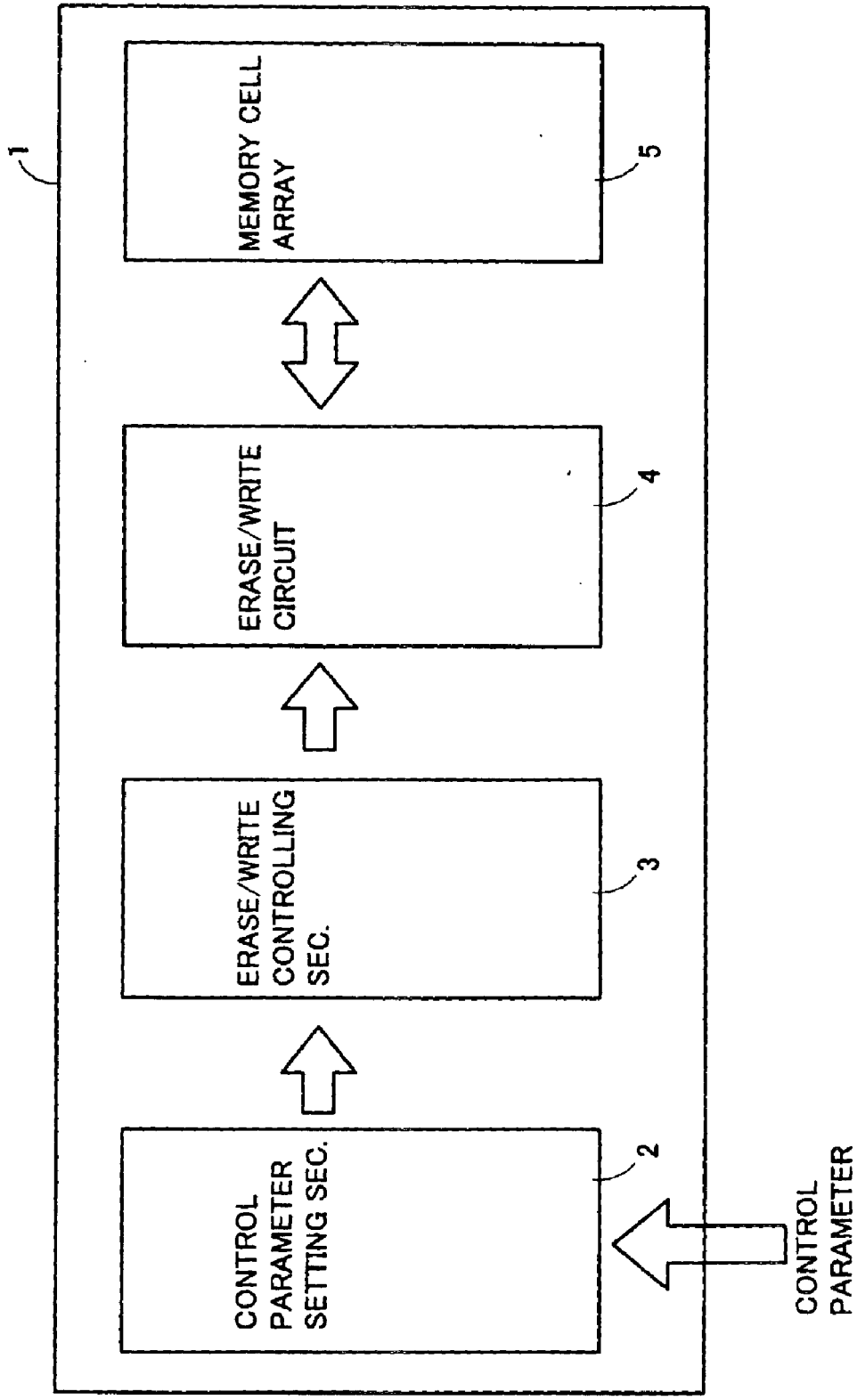
FIG. 7 is a circuit block diagram of non-volatile semiconductor memory device directed to fourth embodiment.
Figure 8:
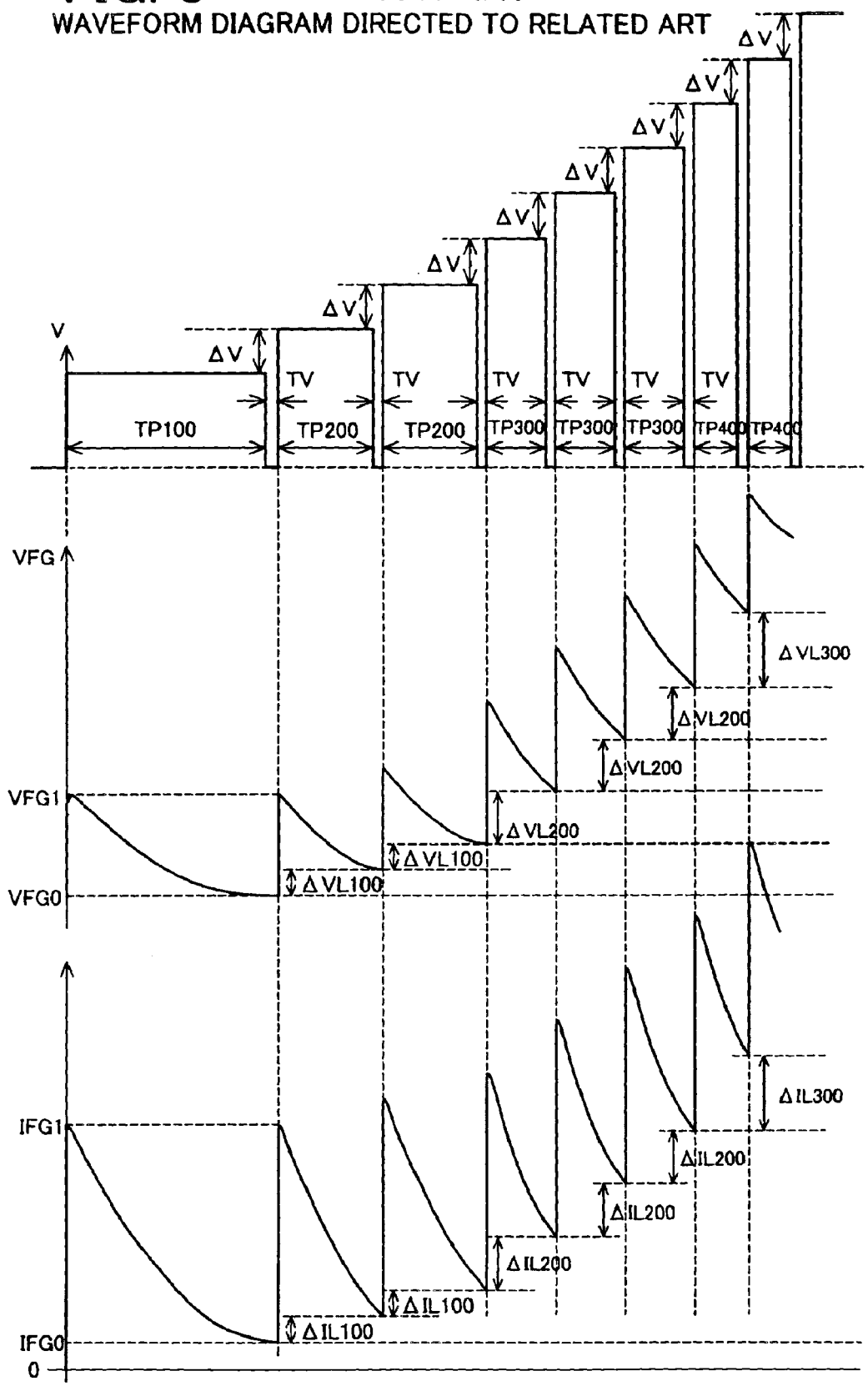
FIG. 8 is a waveform diagram directed to related art.

FIG. 7 shows a non-volatile semiconductor memory device 1 capable of appropriately changing operation sequence of an erase operation or a write operation depending on setting of control parameter at an external portion, directed to a fourth embodiment.

The non-volatile semiconductor memory device 1 comprises: a memory cell array 5 provided with non-volatile semiconductor memory cells; an erase/write circuit 4 for conducting an erase operation or a write operation on non-volatile semiconductor memory cells in the memory cell array 5; an erase/write controlling section 3 for supplying a control signal to the erase/write circuit 4; and, a control parameter setting section 2 for supplying a control parameter to the erase/write controlling section 3.

Non-volatile semiconductor memory cells in the memory cell array 5 are memory cells a cross sectional view of which is structured as shown in FIG. 1 or FIG. 2. They are arranged in a matrix form within the memory cell array 5. Non-volatile semiconductor memory cells generally have transistor characteristic variation to a predetermined extent due to product variation. Due to the characteristic variation, erase characteristic and write characteristic have variation to a predetermined extent as well, for each non-volatile semiconductor memory device 1. To be more specific, there are some non-volatile semiconductor memory devices with characteristic capable of completing a write or erase operation with electric stress less than average characteristic and others with characteristic not capable of completing a write or erase operation without electric stress larger than average characteristic on the contrary. Non-volatile semiconductor memory devices are generally produced with predetermined extent of variations such as above for each one of them.

The erase/write circuit 4 applies various types of bias to respective non-volatile semiconductor memory cells within the memory cell array 5 and includes a circuit for inputting/outputting data. More specifically, the erase/write circuit 4 applies control gate voltage VCG, well voltage VWL, source voltage VS, drain voltage VD and the like and exchange data between memory cells.

The erase/write controlling section 3 controls operations of the erase/write circuit 4. More specifically, the erase/write controlling section 3 controls: various operation timing for erase/write operations; periods of applying bias voltage to control gate voltage VCG and the like; times of bias application; and switching of bias voltages, operation cycles, operation units and the like.

The control parameter setting section 2 is provided with a storage section for storing parameters for various control operations at the erase/write controlling section 3. A storage section may be a fuse or one-time ROM such as only once writable thereon, a rewritable memory element such as a RAM or a non-volatile semiconductor memory cell, a circuit element such as a register capable of holding data, whatever as long as it can store control parameters.

In products' characteristic tests before shipment, characteristic variations of non-volatile semiconductor memory cells due to product variation are examined. Based on the examination results, control parameters that enable products to conduct erase/write operations with high-speed securing reliability of devices.

Appropriate control parameters can be set by considering parameters for bias condition and time or the like until completion of erase/write operation for the first memory cell in a characteristic test of erase/write operation test. That is, for a chip that requires long erase/write time, there are conceived of setting parameters such as follows: a parameter to make bias voltage for initiating erase/write operation and bias voltage at termination of an operation which are deeper than bias voltage for a characteristic test; or a parameter to set timing of accelerating erase/write operation at earlier stage of an operation: or a parameter to shorten duration of operation units in the latter half of erase/write operation; or a parameter to set addition voltage to bias voltage between succeeding two operation units large. For a chip that requires short erase/write time, there can be set parameters contrary to the above. To put those control manners into practice, at least one of the following parameters can be combined with so as to achieve desired operation control of each non-volatile semiconductor memory device, namely, a parameter of: bias voltage; duration of a bias-application period; the number of operation cycles; and in case of changing bias voltage, a parameter of: initial bias voltage, final bias voltage; voltage difference between succeeding bias voltage.

As described, in the control method of a non-volatile semiconductor memory cell directed to the first embodiment, duration of operation units T1 through T3 are determined having positive correlation to initial voltage V0 or addition voltage ΔV that is equivalent to increased voltage difference of bias voltage VCG. More specifically, application of electric field due to floating gate voltage VFG1 induced depending on addition voltage ΔV makes it possible to set duration of operation units T1 through T3 along with time for effective injected current IFG to flow. When injected current IFG decreases and remaining electric field lowers, further bias voltage VCG can be applied without further electric field being applied to remaining electric field. Thereby, a write operation can be conducted efficiently while reliability of structural devices is secured.

Furthermore, injected current IFG is determined to be a single value having positive correlation. Therefore, in case large increased voltage difference is applied as bias voltage VCG, time for injected current IFG to flow becomes longer. By making duration of operation units T1 through T3 longer, injected current effective until to-be-applied electric field lowers can be let flow continuously. Furthermore, in case small increased voltage difference is applied as bias voltage VCG, time for injected current IFG to flow becomes short. Duration of operation units T1 through T3 are shortened so that shift from the current operation unit to the following operation unit can be carried out along with decrease of injected current IFG due to lowering of to-be-applied electric field. In any cases, bias voltage is further applied along with lowering of to-be-applied electric field. That is, without to-be-applied electric field being added, erase or write operation can be conducted in high speed having high reliability.

Furthermore, duration of bias application periods TP1 through TP4 are shortened by each operation unit and at the same time, an interval of a verification period is shortened, as well. As switching of operation units goes further and completion of a write operation comes near, verification can be conducted for each short application of bias voltage VCG and application of bias voltage VCG can be stopped at termination of a write operation. Thereby, reliability deterioration due to unnecessary electric field stress can be suppressed without continuous application of unnecessary bias voltage VCG after end of an operation.

Furthermore, addition voltage ΔV as increase of bias voltage VCG between two succeeding operation units is constant so that duration of each operation unit can be made constant and remaining electric field at the end of each operation unit can be set decreasing sufficiently. Therefore, electric field to be applied to devices becomes equivalent at each operation unit. Floating gate voltage VFG1 at each operation unit is maximized so as to maximize level of to-be-applied electric field and that of injected current IFG1. Thereby, to-be-applied electric field is not added to succeeding operation units and an erase operation or a write operation in high-speed can be realized while device reliability is secured.

Furthermore, provided that total time of bias-application periods TP1 through TP4 excluding verification periods TV is same for each of the operation units T1 through T3, time for applying bias voltage VCG can be made accurately same by each operation unit. Duration of effective injected current IFG flowing in response to to-be-applied electric field due to floating gate voltage VFG can be made same by each operation unit, which contributes to high device reliability and high-speed operation.

Furthermore, in the control method of non-volatile semiconductor memory cell directed to the second or third embodiment, during a first predetermined period that starts at the beginning of a write operation, duration of an operation unit can be set along with time that effective injected current IFG flows due to addition voltage $\Delta V$ as increased voltage different of bias voltage VCG of succeeding two operation units. Thereby, an erase operation or a write operation can be conducted efficiently with device reliability being secured. During a second predetermined period that reaches the end of an erase operation or a write operation, further deeper bias voltage VCG is applied at a stage before injected current IFG lowers to its predetermined current value IFG0. A write operation can be accelerated by increasing injected current IFG accompanied by increase of floating gate voltage VFG. A write operation in high-speed can be realized while device reliability at the beginning of an operation is secured.

Since operation cycles in an operation unit are constant and made of shortened periods, intervals of verification periods TV are shortened in a second predetermined period that reaches end of a write operation. Thereby, verifications can be made often at a stage near end of the write operation and application of bias voltage can be stopped when the write operation completes.

Furthermore, according to the second embodiment, duration of an operation unit is shortened compared with a preceding operation unit in the second bias adjustment step so that application of electric fields to devices for each operation unit can be accelerated for high-speed operation.

Furthermore, according to the third embodiment, voltage difference larger than increased voltage difference of bias voltage VCG between preceding two operation units is applied in the second bias adjustment step so that application of electric fields to devices for each operation unit can be accelerated for high-speed operation.

In the fourth embodiment, there can be set a control parameter for high-speed erase/write operation at the control parameter setting section 2 depending on device characteristic variations of non-volatile semiconductor memory cells, which is due to product variation of the non-volatile semiconductor memory device 1, while device reliability is secured. Since optimum erase operation or write operation can be set along with a device characteristic, a yield of characteristic tests for non-volatile semiconductor memory devices 1 can be enhanced.

The present invention is not limited to the embodiments described above and may of course be improved or modified in various manners within the scope and spirit of the present invention.

For example, the first through third embodiments describe control method of a write operation (FIG. 2) as example of that. However, the present invention is not limited to cases of write operations but is applicable to erase operations by applying bias voltage VCG or VWL to the control gate voltage terminal VCG or to well, similarly. Accordingly, erase current flows in opposite direction and as erase current, ejected current IFG due to FN-tunneling flows instead of injected current IFG.

Though a predetermined current value IFG0 is described as a limited current value in the first embodiment, not to mention, a time point where current stops flowing can be defined as a termination point of an operation unit provided that injected current IFG=0.

Furthermore, the above embodiments have described a case that duration of operation cycles are shortened by each operation unit, as an example. However, as other possible structural examples, there are variations such as structure to make duration of operation cycles uniformly shortest in each operation unit, structure to switch duration of operation cycles to shortest one only when it is a termination point of erase/write operation, and the like.

Furthermore, although it is described that initial voltage V0 for bias voltage VCG and floating gate voltage VFG1 induced by addition voltage $\Delta V$ are equivalent in the embodiments, structure to induce different voltages for respective voltage is possible. In such a case, duration of a first operation unit is adjusted to be different from duration of a second operation unit and following operation units or there can be obtained effects similar to cases of the embodiments.

In the second or third embodiment, it is not necessary to make duration of operation cycles constant among operation units. It is possible to make duration of operation cycles long at an initial stage of erase or write operation as well as to shorten the duration at the end stage of erase or write operation.

Furthermore, as to acceleration operation at a second bias adjustment step, it is described that duration of operation units are shortened by each operation unit or addition voltage for bias voltage VCG between succeeding two operation units is increased, however, it is also possible to control to accelerate by predetermined number of operation units and to accelerate for a first bias adjustment step.

Furthermore, control by combining the second embodiment and the third embodiment is also applicable.

According to the present invention, there can be provided control method and a non-volatile semiconductor memory device capable of erase operation or write operation in high speed while securing reliability without applying excessive electric field.

What is claimed is:

1. Control method of a non-volatile semiconductor memory cell an operation cycle of which consists of a bias-application period for applying bias voltage for data-erase or data-write and a verification period for making a result verification after termination of the bias-application period, and pluralities of the operation cycles of which are repeated for erase operation and write operation to the non-volatile semiconductor memory cell, the control method comprising steps of:

bias adjustment step where the bias voltage becomes deeper by increment of operation unit including at least one operation cycle along with progress of the erase operation or the write operation and duration of the operation unit is controlled to have positive correlation to voltage difference of preceding operation unit and the bias voltage; and verification step where the operation cycle becomes shortest at a stage near end of the erase operation or the write operation.

2. Control method of a non-volatile semiconductor memory cell according to claim 1, wherein, in the bias adjustment step, duration of the operation unit is adjusted depending on time that current for data-erase or data-write carried out by applying bias voltage to the non-volatile semiconductor memory cell decreases to a predetermined current value.

3. Control method of a non-volatile semiconductor memory cell according to claim 1, wherein, in the operation unit that is to reach the verification step, the operation cycle becomes shorter by increment of operation unit.

4. Control method of a non-volatile semiconductor memory cell according to claim 1, wherein, in the bias adjustment step, voltage difference of the bias voltage between the operation units adjacent to each other and duration of the operation unit are same between the operation units adjacent to each other.

5. Control method of a non-volatile semiconductor memory cell according to claim 1, wherein, in the bias adjustment step, voltage difference of the bias voltage between the operation units adjacent to each other and total time of the bias-application period of the operation unit are same between the operation units adjacent to each other.

6. Control method of a non-volatile semiconductor memory cell an operation cycle of which consists of a bias-application period for applying bias voltage for data-erase or data-write and verification period for making a result verification after termination of the bias-application period, and pluralities of the operation cycles of which are repeated for erase operation and write operation to the non-volatile semiconductor memory cell, the control method comprising steps of:
 first bias adjustment step where, during a first predetermined period that begins with start of either the erase operation or the write operation, the bias voltage becomes deeper by increment of operation unit including at least one operation cycle along with progress of the erase operation or the write operation and duration of the operation unit is controlled to have positive correlation to voltage difference of preceding operation unit and the bias voltage; and
 second bias adjustment step where, during a second predetermined period that comes near with end of either the erase operation or the write operation, the bias voltage becomes deeper by increment of operation unit including at least one operation cycle along with progress of the erase operation or the write operation and duration of operation unit is controlled to be short compared with adjustment time taken by the first bias adjustment step.

7. Control method of a non-volatile semiconductor memory cell an operation cycle of which consists of a bias-application period for applying bias voltage for data-erase or data-write and verification period for making a result verification after termination of the bias-application period, and pluralities of the operation cycles of which are repeated for erase operation and write operation to the non-volatile semiconductor memory cell, the control method comprising steps of:
 first bias adjustment step where, during a first predetermined period that begins with start of either the erase operation or the write operation, the bias voltage becomes deeper by increment of operation unit including at least one operation cycle along with progress of the erase operation or the write operation and duration of the operation unit is controlled to have positive correlation to voltage difference of preceding operation unit and the bias voltage; and
 third bias adjustment step where, during a third predetermined period that comes near with end of either the erase operation or the write operation, voltage difference of the bias voltage between operation units including at least one the operation cycles becomes deeper than voltage difference of the bias voltage in the first bias adjustment step.

8. Control method of a non-volatile semiconductor memory cell according to claim 6, wherein a period of the operation cycle is constant in the first bias adjustment step and the second bias adjustment step.

9. Control method of a non-volatile semiconductor memory cell according to claim 6 or 7 further comprising verification step where a period of the operation cycle becomes shortest at a stage near end of the erase operation or the write operation.

10. Control method of a non-volatile semiconductor memory cell according to claim 6, wherein,
 in the first bias adjustment step, duration of the operation unit is adjusted depending on time that current for data-erase or data-write carried out by applying the bias voltage to the non-volatile semiconductor memory cell decreases to a predetermined current value, and
 in the second bias adjustment step, duration of the operation unit is adjusted before time that current for data-erase or data-write carried out by applying the bias voltage to the non-volatile semiconductor memory cell reaches the predetermined current value.

11. Control method of a non-volatile semiconductor memory cell according to claim 9, wherein the verification step is conducted in the second bias adjustment step.

12. Control method of a non-volatile semiconductor memory cell according to claim 6, wherein, in the second bias adjustment step, duration of the operation unit is shortened compared with duration of a previous operation unit.

13. Control method of a non-volatile semiconductor memory cell according to claim 12, wherein, in the second bias adjustment step, number of the operation cycles in the operation unit decreases compared with number of the operation cycles in the previous operation unit.

14. Control method of a non-volatile semiconductor memory cell according to claim 12, wherein, the previous operation unit is an operation unit preceding to the operation unit.

15. Control method of a non-volatile semiconductor memory cell according to claim 6, wherein, in the second bias adjustment step, voltage difference of the bias voltage between succeeding operation units is equal.

16. Control method of a non-volatile semiconductor memory cell according to claim 6, wherein, in the second bias adjustment step, voltage difference of the bias voltage between the succeeding operation units increases compared with voltage difference of the bias voltage previous succeeding operation units.

17. Control method of a non-volatile semiconductor memory cell according to claim 16, wherein the previous operation unit is an operation unit preceding to the operation unit.

18. A non-volatile semiconductor memory device for conducting erase operation or write operation to a non-volatile semiconductor memory cell by repeating an operation cycle of which consists of a bias-application period to apply bias voltage for data-erase or data-write and a verification period to make a result verification after termination of the bias-application period, the non-volatile semiconductor memory device comprising:
 a control parameter setting section for setting a control parameter for the erase operation or the write operation; and
 a control section for controlling the erase operation or the write operation in accordance with the control parameter from the control parameter setting section.

19. A non-volatile semiconductor memory device according to claim 18, wherein the control parameter setting section includes a memory section in which the control parameter can be set from outside of the device.

20. A non-volatile semiconductor memory device according to claim 19, wherein the memory section is rewritable.

21. A non-volatile semiconductor memory device according to claim 18, wherein the control parameter holds true with at least one of followings:
   (a) the bias voltage applied to the non-volatile semiconductor memory cell for the erase operation or the write operation; or
   (b) duration of the bias-application period; or
   (c) times of the operation cycles; or
   (d) initial bias voltage in case the bias voltage is changed; or
   (e) final bias voltage in case the bias voltage is changed; or
   (f) voltage difference between bias voltages.

22. A non-volatile semiconductor memory device according to claim 18, wherein, in an erase characteristic operation or a write characteristic operation, the control parameter is set based on time to verify termination of an erase operation or termination of write operation and bias condition until the termination.

* * * * *